United States Patent [19]

Gold

[11] 4,205,264
[45] May 27, 1980

[54] HIGH IMPEDANCE ELECTRICAL TESTING INSTRUMENT FOR AC AND DC VOLTAGE DETECTION AND CONTINUITY TESTING

[76] Inventor: Charles Gold, 8840 NW. 16th St., Plantation, Fla. 33322

[21] Appl. No.: 899,794

[22] Filed: Apr. 25, 1978

[51] Int. Cl.² .................... G01R 31/02; G01R 19/16; G01R 1/06
[52] U.S. Cl. .................................. 324/51; 324/72.5; 324/133
[58] Field of Search ............... 324/51, 72.5, 133, 149, 324/123 R, 62

[56] References Cited

U.S. PATENT DOCUMENTS

| | | | |
|---|---|---|---|
| 2,474,073 | 6/1949 | Sundt | 324/122 X |
| 2,808,565 | 10/1957 | Zuti et al. | 324/133 X |
| 3,183,439 | 5/1965 | Rosinek | 324/133 X |
| 3,337,801 | 8/1967 | Rinier et al. | 324/149 X |
| 3,437,928 | 4/1969 | Baker et al. | 324/133 |
| 3,774,110 | 11/1973 | Roueti | 324/133 |
| 3,828,256 | 8/1974 | Liu | 324/133 |
| 3,878,459 | 4/1975 | Hanna | 324/133 X |
| 4,006,409 | 2/1977 | Adams | 324/133 X |
| 4,066,953 | 1/1978 | Gold | 324/133 X |
| 4,084,134 | 4/1978 | Nagano | 324/133 |

Primary Examiner—Gerard R. Strecker
Attorney, Agent, or Firm—Warren, Chickering & Grunewald

[57] ABSTRACT

An electrical testing instrument including a high gain amplifier circuit having a pair of inputs, one comprising a probe and the other covered at least in part by a non-conductive material and being adapted for manual engagement by the user for completing an input circuit through the body of the user. The circuit has a battery and a current-responsive indicator in its output circuit to provide a signal when current flows in the input current to provide a critical forward biasing of the amplifier. The battery is connected to furnish such input current when the input terminals are connected in a closed circuit having a resistance of at least approximately the resistance of the user's body. The amplifier circuit is further arranged that when the probe is contacted with a live AC power line and the user engages the portion of the manually engageable input terminal which is covered with a non-conductive material, an operating indicating current will also be present in the output circuit.

1 Claim, 3 Drawing Figures

HIGH IMPEDANCE ELECTRICAL TESTING INSTRUMENT FOR AC AND DC VOLTAGE DETECTION AND CONTINUITY TESTING

BACKGROUND OF THE INVENTION

1. Field of Invention

The invention relates to instruments used by electricians and electronic technicians for indicating the presence or absence of continuity, or the presence or absence of an electrical potential in an electric circuit. An example of a continuity-voltage indicating device is found in my U.S. Pat. No. 4,066,953, which issued on Jan. 3, 1978. An example of a continuity tester is the usual ohm meter, and examples of voltage-indicating devices are the usual neon tester and voltmeter.

2. Description of Prior Art

The ohm meter may most simply consist of a battery in series with a current-reading meter and which is connected in series with the electrical path whose continuity is to be checked. Another commonly used continuity tester may consist simply of a battery in series with a lamp bulb where a quantitative resistance determination is not required.

The common voltage-sensing instruments above noted (neon tester and voltmeter) are not usable by themselves and without further implementation for sensing continuity in electrical circuits, and similarly, the continuity testers in common use by electricians and technicians are not usable by themselves and without further implementation for determining the presence of an electrical potential. These two types of instruments are perhaps the most universally used by electricians and technicians, and a single compact, portable and easily carried unit performing both of these diverse functions would be most useful.

Certain more sophisticated instruments using solid-state amplifiers have been designed for specific applications, principally low resistance sensing, see U.S. Pat. Nos. 3,283,244 and 3,328,684; British Pat. No. 910,045/1962; and French Pat. No. 1,236,403/1960. These specialized testers have been designed for sensing and indicating very low resistance from just a few ohms to a few thousand ohms; have no use as a continuity tester in circuits having a much higher resistance, e.g., up to 1 megohm or more; and cannot be used for any practical voltage sensing, at least in the higher ranges of voltage normally encountered by the electrician or technician.

The instrument of the present invention affords certain advantages over the instrument disclosed in my U.S. Pat. No. 4,066,953 in its ability to distinguish AC and DC voltages and its assurance against possible shock hazard as might be caused by accidental breakdown or shortage of insulation or components affording normal isolation in the circuitry of the instrument.

SUMMARY OF THE INVENTION

An object of the present invention is to provide a small, compact and readily carried test instrument of the character described, having a universal use and application in sensing;

(a) extremely small current, as low as 1 microampere or less;
(b) a resistance range from 0 to 1 megohm or more;
(c) electrical leakage from a power line to the frame or casing of a machine or equipment, even when the leakage resistance is very great, e.g., up to 50 megohms or more;
(d) the aforementioned leakage current in the case of AC power without the requirement of a separate instrument-grounding lead;
(e) of the presence of AC power at wall outlets, fuses, circuit breakers and the like, again without use of a separate instrument-grounding lead;
(f) of leakage, shorts, and approximate capacitance of capacitors; and
(g) presence and polarity of DC power over the usual range of batteries and voltages most frequently encountered in electronic circuits.

The present invention is designed to be hand-held, with one hand of the user engaging the case of the unit, which provides one of the input leads so as to normally, although not necessarily, place the body of the user in series with the circuit being tested. The instrument is provided with a test probe which in normal use provides the second input terminal for the tester. Thus, no separate leads, clips or external wires are normally involved in the use of the tester. The interposing of the user's body in the input circuit of the tester adds a high input resistance to the input circuit. The latter, i.e., input circuit, is additionally provided with a relatively high input resistor which serves as a protective device for the transistors in the amplifying circuit and also cofunctions with the body resistance of the user to reduce the input current in all instances to a very small value, thus assuring complete safety to the user as well as to the internal, sensitive, solid-state devices. The very small operating input current, for example, will enable the continuity testing of very sensitive devices, such as flashbulbs, without danger of ignition. Similarly, the hand-held instrument of the present invention may be used with safety to the user as well as the instrument in testing AC power line connections, even though the body of the user is grounded.

An additional and highly important feature of the present invention is its ability to sense and indicate the presence of AC potentials without the need for the user being directly connected to the manually engageable input terminal. I have found that by covering at least a portion of the manually engageable input terminal with varnish, plastic, or other electrically non-conductive material that the device will indicate the presence of an AC potential when the probe is connected directly to the AC voltage source and the user grasps the insulated portion of the manually engageable input terminal, the non-conductive covering providing a final barrier against shock in addition to the high input resistance of the testing instrument. The instrument will not function as a continuity tester or DC voltage indicator when the user engages the insulated portion of the manually engageable input terminal and thus affords a ready means of distinguishing the presence of AC and DC voltages.

One of the unexpected attributes of the earlier instrument, as disclosed in U.S. Pat. No. 4,066,953, was its ability to detect the presence of AC voltage when the input probe was engaged with a live AC line or the like and the other input terminal, the metallic case for the instrument, was merely held in the hand of the user, without requiring a return, or ground, connection to the AC power soruce. I have found that the phenomenon involved continues to operate, notwithstanding that the electric conducting case is sheathed or covered by a layer of electrical insulating material. The instrument of the present invention will so function to detect AC voltage over a very wide frequency range, as for example, from conventional 60 hertz AC power through 27 megahertz RF power found in the output of citizens' band transmitters. The present invention thus offers advantages over the earlier instrument without forfeiting any of the features of the earlier device.

The invention possesses other objects and features of advantage, some of which of the foregoing will be set forth in the following description of the preferred form of the invention which is illustrated in the drawings accompanying and forming part of this specification. It is to be understood, however, that variations in the showing made by the said drawings and description may be adopted within the scope of the invention as set forth in the claims.

DETAILED DESCRIPTION OF INVENTION

Figure 1:
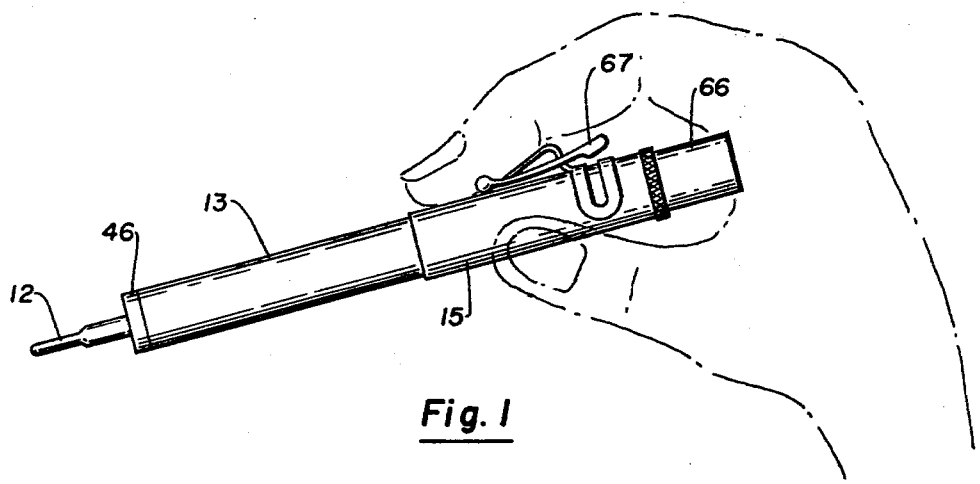
FIG. 1 is a side elevation of a combination continuity and voltage tester constructed in accordance with the present invention and depicted in use.

The electrical testing instrument of the present invention comprises, briefly, an amplifier circuit 11 having a pair of input terminals, terminal 12 being a probe and terminal 13 comprising an elongated metal case adapted for manual engagement by by user for completing an input circuit through the body of the user, a portion of the input terminal 13 covered by a sleeve 15 of electrically non-conductive material, the amplifier also having an output circuit 14; a battery 16; and a current-responsive indicator 17 connected in output circuit 14, indicator 17 providing a manually discernible signal at and above an operating current flow, and the amplifier circuit providing such current flow in the output circuit when the input circuit 18 is biased in a forward direction at and above a critical bias current; battery 16 being connected to furnish such critical forward bias current when input terminals 12 and 13 are connected in a closed circuit having a resistance at least approximately the resistance of the user's body; and the amplifier circuit being so constructed that when probe 12 is connected to a live terminal 21 of a power line 22 providing approximately 110 volts AC and either input terminal 13 or sleeve 15 is manually engaged, the AC potential will provide the aforementioned critical forward bias current.

In order to adapt the instrument to its various conditions of use, as more fully discussed herein, amplifier circuit 11 should have a gain of at least about 25,000 and, preferably, in the range of about 25,000 to about 60,000. Such an amplifier may comprise a Darlington pair, as here illustrated, or one or more field-effect transistors (FETS), metal oxide semiconductor field-effect transistors (MOSFETS), or an integrated circuit amplifier. Also, to protect the solid-state devices, an input resistor 20 is inserted in the input circuit and, preferably, has a resistance of about 50,000 ohms. As here shown, resistor 20 is connected between probe 12 and the base 26 of a first Darlington transistor 27. The emitter 28 of transistor 27 is connected to the base 29 of a second Darlington transistor 30. Emitter 31 of transistor 30 is connected by conductor 53 in output circuit 14 in series with battery 16 and indicator 17, the latter being connected to the collectors 32 and 33 of transistors 28 and 30 to complete the output circuit. The configuration shown is for NPN transistors. PNP transistors may be substituted with a reversal of the battery connections. Preferably, a capacitor 36 is connected across resistor 20 so as to enhance the sensitivity of the instrument when used for indicating the presence of alternating current, energy or power.

Another feature of the present invention is that the input terminal 13 is connected by conductor 13 to output circuit 14, specifically at collectors 32 and 33, so as to provide a feedback of energy from battery 16 to the input circuit for inducing the forward bias as above discussed. Importantly, and as will be noted for FIGS. 2 and 3, the feedback connection to terminal 13 is taken at the side of indicator 17 opposite to the side of the indicator which is connected to battery 16. Accordingly, as current is drawn in the input circuit, a voltage drop will occur across indicator 17, thus providing a self-regulating function.

Various types of indicators may be used, such as incandescent lamp bulbs, light-emitting diodes, buzzers and the like. Of these, a small incandescent filament bulb is preferred. A nominally 60-milli-ampere incandescent bulb, rated at 2 volts, has been found to provide excellent visual signal qualities over a substantially unlimited life. This bulb will stand temporary overloads up to 80 milli-amperes and more without failure and will provide a clear visual signal down to about 35 milli-amps. Battery 16 here provides about 4.5 volts DC, which may be readily obtained from three small dry cells in series.

The instrument may be assembled, as seen in FIG. 1, in a small, compact, elongated form for pocket mounting, carrying and handling in much the same manner as a fountain pen or pencil. The main body comprises an elongated tubular metal case 13 which may be formed of aluminum or other sturdy, lightweight and current-conducting material. Probe 12 is here formed as an elongated metallic contact member carried by and projecting from an insulator disc 46 secured at one end of the case. A hollow, cylindrical, open-ended cap 66 is here secured to the opposite end of the case enclosing bulb 17, and a pocket-engaging clip 67 may be mounted on the case adjacent the bulb for convenient mounting in the pocket of the user in typical pen or pencil fashion.

Figure 2:
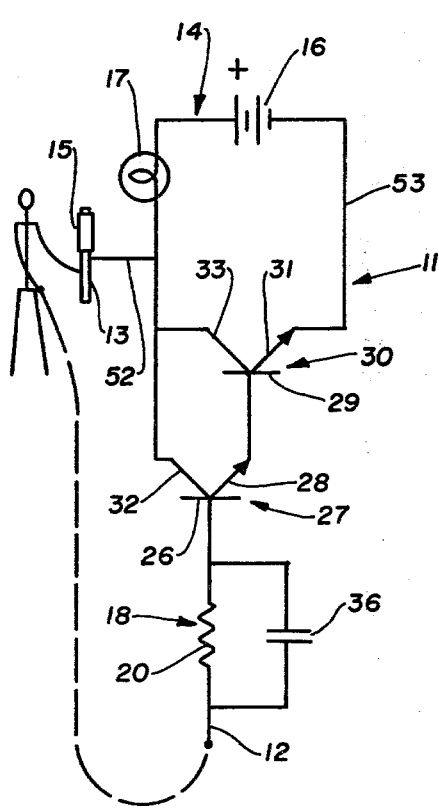
FIG. 2 is an electrical schematic diagram of the tester as used for continuity testing.
Figure 3:
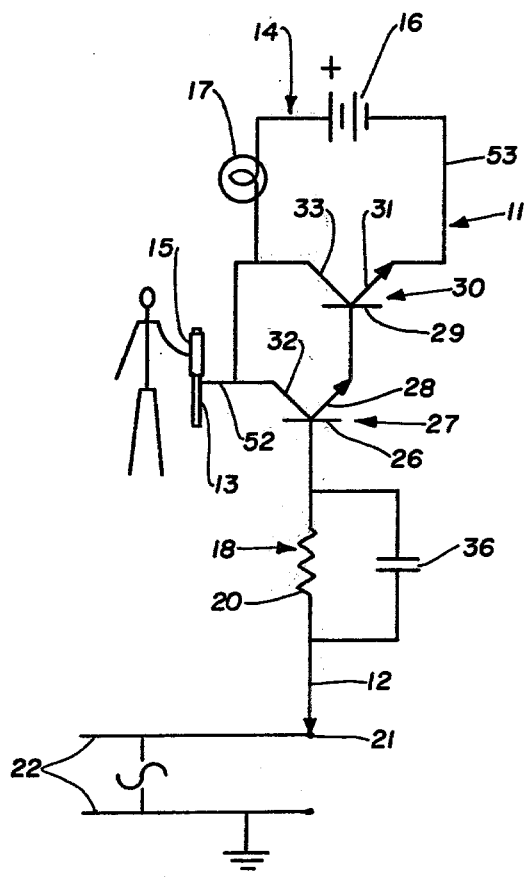
FIG. 3 is an electrical schematic diagram of the tester as used for sensing AC voltage.

When the circuit is used to measure continuity, as depicted in FIG. 2, the maximum current drawn in the input circuit where the external circuit resistance is 0 will be in the order of up to about 2 micro-amperes. Normally, the body of the user will insert a resistance of between 50,000 and 100,000 ohms, depending upon the quality of body contact. As the resistance of the external circuit increases, the input current decreases. For example, for external resistances of 100,000 ohms and 1 megohm, the input current will be about 1.5 micro-amperes and 1 micro-ampere respectively. Where a lead is used to make the connection to the case, rather than taking the current through the body, the input current was found to increase only a fraction of a micro-ampere in each instance. Over these same resistance measurements, it will be noted that the output current will vary from about 45 milli-amps to about 70 milli-amps. As voltage is applied to the input circuit, the input current will increase from about 1½ micro-amps at 0 volts to about 40 micro-amps at 40 volts DC. When checking a live power line for AC voltage, the maximum current in the input circuit will be approximately 30 micro-amperes. In such test, the case 13 or the sleeve 15 is hand-held and the probe 12 contacted with the live AC terminal. No other connection is made to the other hand or body of the user. It has been determined, however, that if the other hand or the body of the user makes a good ground contact, the current in the input circuit will only raise to about 1 milli-ampere, which is, of course, entirely safe. When the user holds the insulating sleeve rather than the case 13, the current flow through his body is lower. The sleeve 15 protects the user from serious electrical shock which could result from an internal short circuit in the instrument. When testing for AC power, the output current will increase from about 38 milli-amperes at about 35 volts to about 48 milli-amperes at 200 volts, the AC circuit being opened, with only the test probe 12 connected to the live AC voltage, as depicted in FIG. 3. 35 volts AC is about the lower limit of the instrument as here constructed when used in this manner. In testing for the presence of DC volts, where the input current is taken through the body of the user or direct, as by use of a separate lead, the output current holds relatively constant, in the range of about 70–80 milli-amperes over a wide voltage range of about 1.5 volts (the usual single dry cell battery) to about 200 volts. It will be noted that the output current is only slightly higher when the instrument is used direct rather than through the body.

As hereinabove noted, any increase in current through the transistor is accompanied by an increase in current through the bulb and, accordingly, a larger voltage drop at the collector. Since the collector is directly connected to the case, and the case forms one of the input terminals, any voltage drop reflected at the collector is similarly reflected at the input terminal, thus decreasing the bias to the input. Accordingly, it is seen that the circuit is self-regulating.

Another important feature is protecting the bulb against burnout and protecting against too high currents in the output circuit is the fact that the resistance of the bulb filament will increase rapidly with increased current through the filament, thus further and automatically limiting the current flow.

Finally, it will be noted that in the AC operating mode of the tester, as seen in FIG. 3, the input circuit is essentially open-circuited. There is, nevertheless, a sufficient transfer of radiated energy to the body to cause the requisite, although very small, current flow in the input circuit. Thus, the instrument will detect leakage current in power-operated medical and other equipment and the like, where the leakage current may be extremely small. The instrument has been found effective in measuring such leakage current through leakage resistance of up to 10 megohms or more, which is difficult to measure with ordinary instruments which draw significant current. Leakage current through internal resistance of 40 megohms has been detected. The very small required input current enables the instrument to detect continuity in such delicate devices as flashbulbs without danger of actuating the flashbulb.

The instrument may be used as described in U.S. Pat. No. 4,066,953 for testing capacitors for short, open circuit, or leakage. The instrument may also be used for testing polarity of DC circuits, diodes, rectifiers and transistors in forward and reverse directions by observing the signal, or the lack thereof, of indicator 17.

Finally, it will be observed that all of the uses and tests described herein can be made without the use of any ground leads, clips, or separate wires, the instrument being entirely self-complete in its hand-held position.

The present instrument does not require a switch to open the battery circuit when the instrument is not in use. The transistor current in the non-operating state of the device is so very small as to not significantly impair the shelf life of the battery.

What is claimed is:

1. An electric testing instrument comprising:
a housing having a wall of electrically conductive material adapted for manual engagement by the user and forming an input terminal for completion of an input circuit through the body of the user;
an amplifier mounted in said housing and having its input connected to an input circuit comprising a probe providing a second input terminal adapted for engagement with an electric signal, said amplifier having an output circuit comprising in series a collector, an emitter, a battery and a current responsive indicator;
said housing wall being connected to the side of said battery connected to said collector and having polarity opposite said emitter;
said indicator providing a manually discernible signal at and above an operating current flow in said output circuit, said amplifier having a gain sufficient to provide said operating current flow in said output circuit when said input circuit is biased with an input current;
said input circuit providing said input current derives solely from said battery when said input terminals are connected across a resistance from zero ohms to as high as at least one megohm;
an electrically nonconductive material covering a portion of said housing wall;
said amplifier having a sufficient gain to provide said operating output current flow when said probe is connected to a conventional live power line providing approximately 110 volts a.c. and said nonconductive material is manually engaged by the user; and
said material covering a part only of said wall leaving an uncovered portion for direct manual engagement by the user for through the body continuity testing and for detecting the presence of d.c. voltage, thereby enabling the user to distinguish between a.c. and d.c. signals.

* * * * *

UNITED STATES PATENT AND TRADEMARK OFFICE
CERTIFICATE OF CORRECTION

PATENT NO. : 4,205,264
DATED : May 27, 1980
INVENTOR(S) : CHARLES GOLD

It is certified that error appears in the above-identified patent and that said Letters Patent are hereby corrected as shown below:

Col. 2, line 14, delete "invention" and insert

---instrument---;

Col. 3, line 31, delete the second "by" and insert

---the---; and

Col. 5, line 19, after "limit of" insert ---use of---.

Signed and Sealed this

Twenty-eighth Day of October 1980

[SEAL]

Attest:

SIDNEY A. DIAMOND

Attesting Officer

Commissioner of Patents and Trademarks